(12) United States Patent
Chang et al.

(10) Patent No.: US 6,197,667 B1
(45) Date of Patent: Mar. 6, 2001

(54) STRUCTURE AND METHOD FOR MANUFACTURING GROUP III-V COMPOSITE SCHOTTKY CONTACTS ENHANCED BY A SULPHUR FLUORIDE/ PHOSPHORUS FLUORIDE LAYER

(75) Inventors: Liann-Be Chang, Taoyuan Hsien; Hung-Tsung Wang, Taipei Hsien, both of (TW)

(73) Assignee: National Science Council, Taipei (TW)

( * ) Notice: Subject to any disclaimer, the term of this patent is extended or adjusted under 35 U.S.C. 154(b) by 0 days.

(21) Appl. No.: 09/244,290

(22) Filed: Feb. 3, 1999

Related U.S. Application Data (62) Division of application No. 08/940,234, filed on Sep. 30, 1997.

(51) Int. Cl.[7] .............................. H01L 21/28; H01L 21/44
(52) U.S. Cl. .............................. 438/570; 438/572; 438/92
(58) Field of Search .............................. 438/92, 167, 172, 438/534, 570, 572

(56) References Cited

U.S. PATENT DOCUMENTS

| 3,619,288 | 11/1971 | Sirti ..................................... 427/584 |
| 5,585,649 | 12/1996 | Ishikawa et al. ..................... 257/94 |
| 5,796,127 | 8/1998 | Hayafuji et al. ..................... 257/194 |

OTHER PUBLICATIONS

Hwang, K. et al., A Study of New Surface Passivation Using $P_2S_5/(NH_4)_2S$ on GaAs Schottky Barrier Diodes, *J. Appl. Phys.*, 67(4):2162–2165 (Feb. 15, 1990).

Ali, S. et al., "Ruthenium and Sulphide Passivation of GaAs", *Applied Surface Science*, 93:37–43 (1996).

Sakata, M. et al., "Electrical Characteristics and Surface Chemistry of $P_2S_5$–Passivated GaAs", *Jpn. J. Appl. Phys.*, 33:3813–3824 (1994).

*Primary Examiner*—Carl Whitehead, Jr.
*Assistant Examiner*—Jamie L. Davis
(74) *Attorney, Agent, or Firm*—Merchant & Gould P.C.

(57) ABSTRACT

Group III–V composites, which is used to manufacture Schottky contacts having the characteristics of higher energy gap, higher carriers mobility, etc., are applied for manufacturing high-speed devices. Therefore, in there years, Group III–V composite Schottky contacts are continuously being developed. In the invention, the surface treatment of composite semiconductor is used for reduce a surface state and oxidation, thereby increased the Schottky barriers of the Group III–V composite (such as, GaAs, fnP, InAs and InSb) Schottky contacts. During experiments. a phosphorus sulphide/ammonia sulphide solution and hydrogen fluoride solution are used for the surface treatment to increase the amount of sulphur contained on the surfaces of substrates, reduce the surface state and remove various oxides. Furthermore. ultra-thin and really stable sulphur fluoride/ phosphorus fluoride layers having high energy gaps are formed on various substrates. Then, the sulphur fluoride/ phosphorus fluoride layers are sputtered by a single electron gun with metals Ag, Au, Ni and Pt to form Schottky contacts. In addition, a UV ray is performed for enhancing the Schottky contacts. The result shows that event thought the Schottky contacts formed by various Group III–V composites (such as GaAs, InP, InAs and InSb) and various metals are baked for 18 hrs. at a temperature of 300° C., their Schottky barriers can still reach about 1.1 eV, 0.95 eV, 0.37 eV and 0.19 eV, respectively. Therefore, Schottky contacts with high yield can be manufactured according to the invention.

6 Claims, 9 Drawing Sheets

FIG.1

| | (GaAs) $(N_d=2 \times 10^{15})$ | | | (InP) $(N_d=3.5 \times 10^{15})$ | | | | (InAs) $(N_d=4.5 \times 10^{15})$ | | | | (InSb) $(N_d=1.2 \times 10^{16})$ | | | |
|---|---|---|---|---|---|---|---|---|---|---|---|---|---|---|---|
| | I-V | | C-V | I-V | | C-V | | I-V | | C-V | | I-V | | C-V | |
| | n | $\Phi_{I-V}$ $\Phi_{C-V}$ | Nd (cm$^{-3}$) | n | $\Phi_{I-V}$ | $\Phi_{C-V}$ | Nd (cm$^{-3}$) | n | $\Phi_{I-V}$ | $\Phi_{C-V}$ | Nd (cm$^{-3}$) | n | $\Phi_{I-V}$ | $\Phi_{C-V}$ | Nd (cm$^{-3}$) |
| Enhanced Schottky diode with fluoridation and treatments | 1.17 | 1.1  1.11 | 2.27 × 10$^{-17}$ | 1.17 | 0.95 | 0.96 | 9.04 × 10$^{-15}$ | 1.16 | 0.37 | ....a | .... | 1.11 | 0.19 | .... | .... |
| Conventional Schottky diode just with a sulphuration treatment | 1.11 | 0.78 0.79 | 2.04 × 10$^{-17}$ | 1.08 | 0.61 | 0.63 | 9.71 × 10$^{-15}$ | 1.15 | 0.24 | .... | .... | 1.07 | 0.17 | .... | .... |
| Schottky diode just a fluoridation treatment and without a sulphuration treatment | 1.08 | 0.81 0.82 | 1.73 × 10$^{-17}$ | 1.06 | 0.64 | 0.66 | 1.12 × 10$^{-16}$ | 1.06 | 0.22 | .... | .... | 1.02 | 0.16 | .... | .... |
| Schottky diode without fluoridation and sulphuration treatments | 1.02 | 0.58 0.59 | 1.68 × 10$^{-17}$ | 1.01 | 0.31 | 0.32 | 9.81 × 10$^{-16}$ | 1.03 | 0.11 | .... | .... | 1.03 | 0.16 | .... | .... |

[a] This barrier height is too low to be analyzed.

FIG.2

| Name of compound | Chemical binding energy $\Delta H^0$(Kcal/mole) |
|---|---|
| $SF_6$ | -291.8 |
| $PF_3$ | -220.0 |
| $PF_5$ | -381.1 |
| $Ag_2S$ | -7.3 |
| $AgP_2$ | -10.7 |
| $AgP_3$ | -16.5 |
| InSb | -7.4 |
| InAs | -13.8 |
| InP | -18 |
| GaAs | -19.5 |
| $In_2O_3$ | -221.3 |
| $Ga_2O_3$ | -258.8 |
| $As_2O_3$ | -156.1 |
| $As_2O_5$ | -218.5 |
| InS | -32 |
| $In_2S_3$ | -85 |
| $In_5S_6$ | -185 |
| GaS | -50 |
| $Ga_2S_3$ | -122.8 |

STRUCTURE AND METHOD FOR MANUFACTURING GROUP III–V COMPOSITE SCHOTTKY CONTACTS ENHANCED BY A SULPHUR FLUORIDE/ PHOSPHORUS FLUORIDE LAYER

This application is a Divisional of application Ser. No. 08/940,234, filed Sep. 30, 1997, which application is incorporated herein by reference.

BACKGROUND OF THE INVENTION

1. Field of the Invention

The invention relates to a structure and method for manufacturing group III–V composite Schottky. contacts having high-temperature proof, oxidation resistance and low reverse leakage currents.

2. Description of Related Art

As to the prior art, please refer to "Ruthenium and sulphide passivation of GaAs" by S. T. Ali et al, Applied Surface Science 93 (1996) 37–43 and "Electrical Characteristics and Surface Chemistry of $P_2S_5$-Passivated GaAs" by Minorn Sakata et al, Jpn., J. Appl. Phys. Vol. 33(1994) PP. 3813–3824 Contact barriers of Schottky contacts affected by surface state and impurities is mentioned in those papers. Currently, a sulphuration treatment is used to decreased oxidation and defects, thereby efficiently increasing Schottky barriers. However, since a compound formed by sulphur and semiconductor material has a low bonding energy, the sulphur is easily volatilized. In this case, if these devices are put into the environment with air or with higher temperature for a long time, the surfaces of the substrates which have been through the sulphuration treatment appear a high oxidation state resulting in low Schottky barriers. Therefore, the manufactured devices cannot operate under a high temperature for a long time. This problem is desired to be resolved by semiconductor industry.

SUMMARY OF THE INVENTION

The invention relate to a method for manufacturing various Schottky contacts, which resolves the oxidation state on the surfaces of the Group III–V composite semiconductors by forming a thin and stable sulphur fluoride/phosphorus layer, and in particular to a method for increasing Schottky barriers and decreasing the surface state.

In Schottky contacts manufacturing, the surface state, surface oxidation and voids and other defects of epitaxial layers obviously affect Schottky barriers, reverse leakage currents and breakdown voltage.

By using a chemical reaction technique to form thin composite semiconductor layers on semiconductors, it is helpful to stabilize the surface state, prevent oxidation and improve a Fermi energy level pinning effect, thereby increasing the Schottky barriers between metals and semiconductors. Even though there are various complicated steps in the Schottky contacts manufacturing, how to decrease the surface oxidation is a key to success. Therefore, this problem is desired to be resolved in semiconductor industry.

As can be known from the above, the object of the invention is to provide a method with simplicity and high-repeatation for efficiently resolving the above-mentioned problem. The other object of the invention is to provide a method for manufacturing Group III–V composite Schottky contacts having high production value.

BRIEF DESCRIPTION OF THE DRAWINGS

The invention will become more fully understood from the detailed description given hereinbelow and the accompanying drawings which are given by way of illustration only, and thus are not limitative of the present invention, and wherein.

DETAILED DESCRIPTION OF THE INVENTION

By using various sulphides, such as $H_2S$ and $(NH_4)_2S_x$, to increase a Group III–V semiconductor Schottky barrier has been adopted for many years. However, various sulphur-containing solutions are used just for a sulphuration treatment in the prior art. Furthermore, since the sulphur cannot react with various Group III–V composites to create stable sulphides, the devices cannot operate under a high temperature environment and their stability varies inversely as the temperature. In this case, the sulphur is easily volatilized, such that the Schottky characteristics are greatly affected. The difference between the invention and prior art resides in that fluorine-containing compounds are applied. For example, various sulphur-treated substrate reacts with hydrogen fluoride to create a high stable phosphorus fluoride/sulphur fluoride layer on the surface of the semiconductor, thereby resolving the problem in the prior art.

Figure 1:
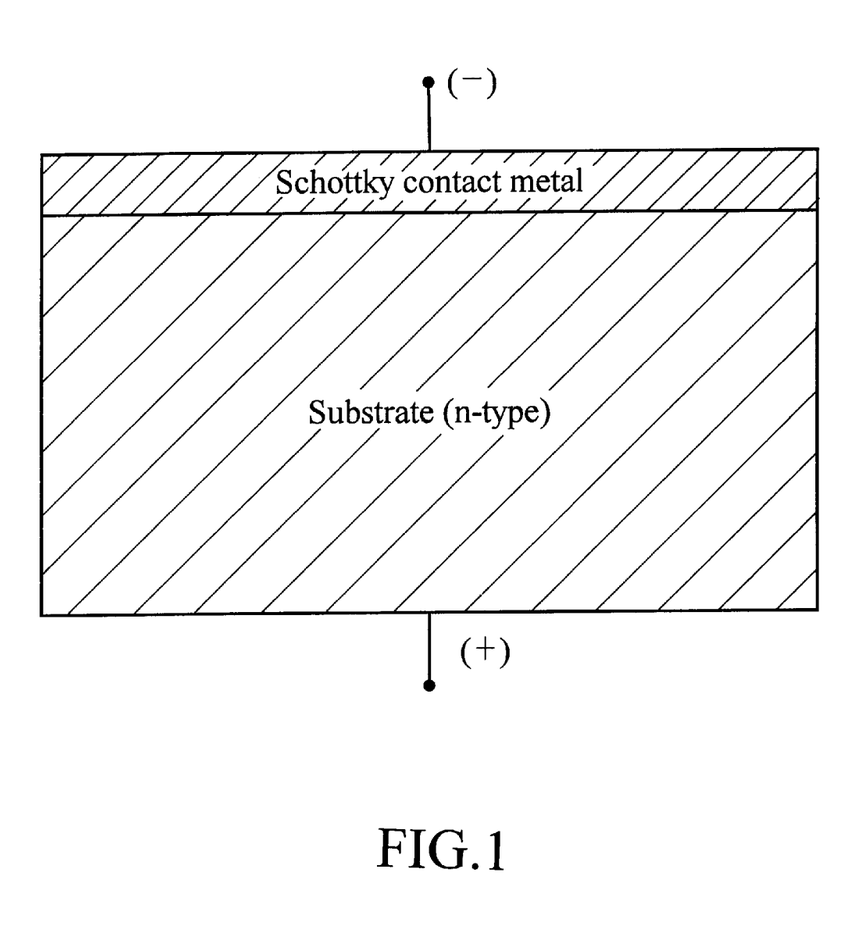
FIG. 1 is a cross-sectional view showing a conventional Schottky contact.
Figure 2:
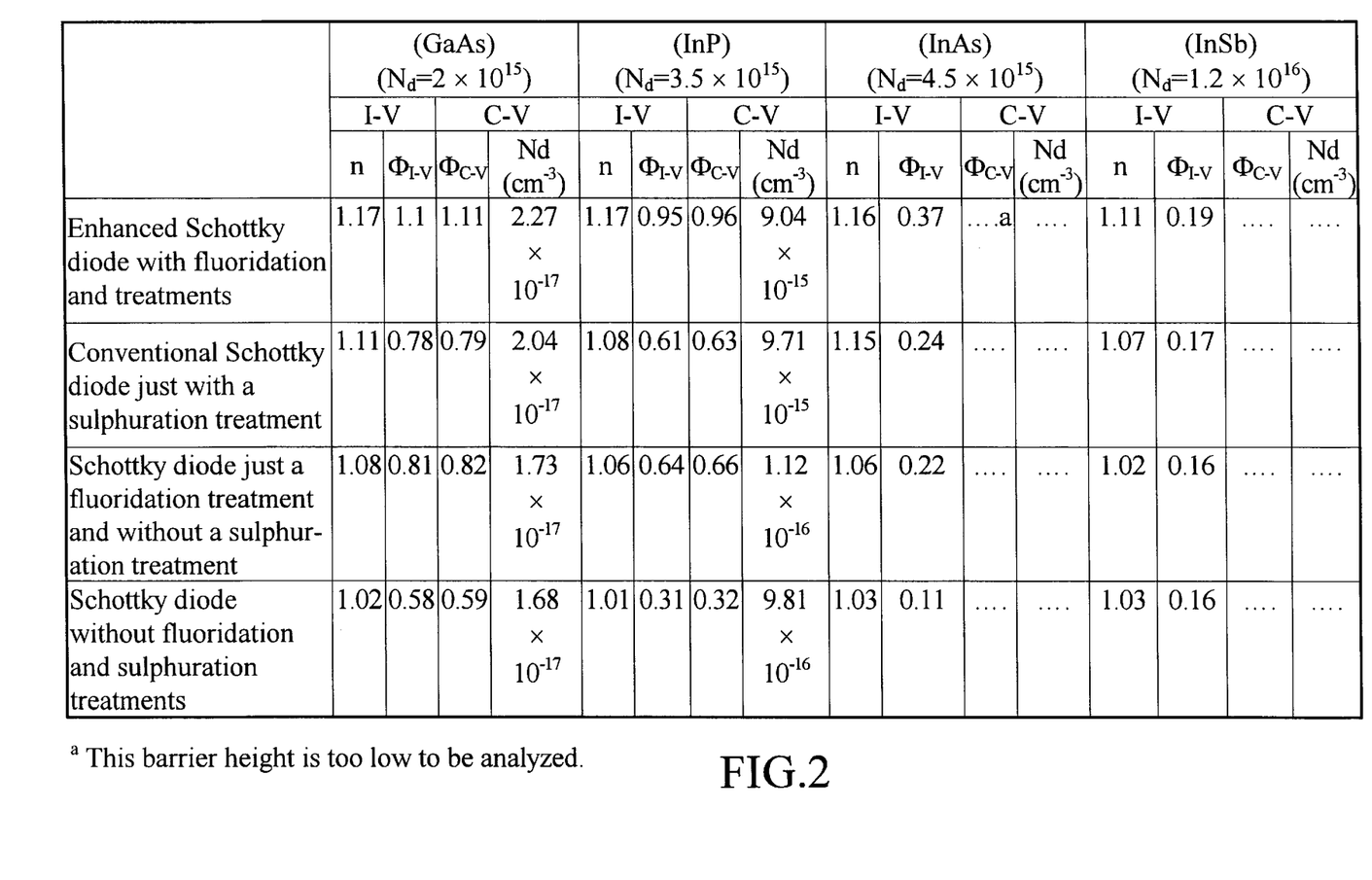
FIG. 2 is a schematic view showing various results of measuring GaAs, InP, InAs, and InSb Schottky contacts sputtered with metal Ag under corresponding to various conditions (for example, standard factors n and Schottky barriers Φ are measured by using the relationship between current-voltage (I–V) and capacitance-voltage (C–V) after substrates with/without a fluoridation treatment or with/without a sulphuration treatment are baked for 18 hrs. at a temperature of 300° C.
Figure 3:
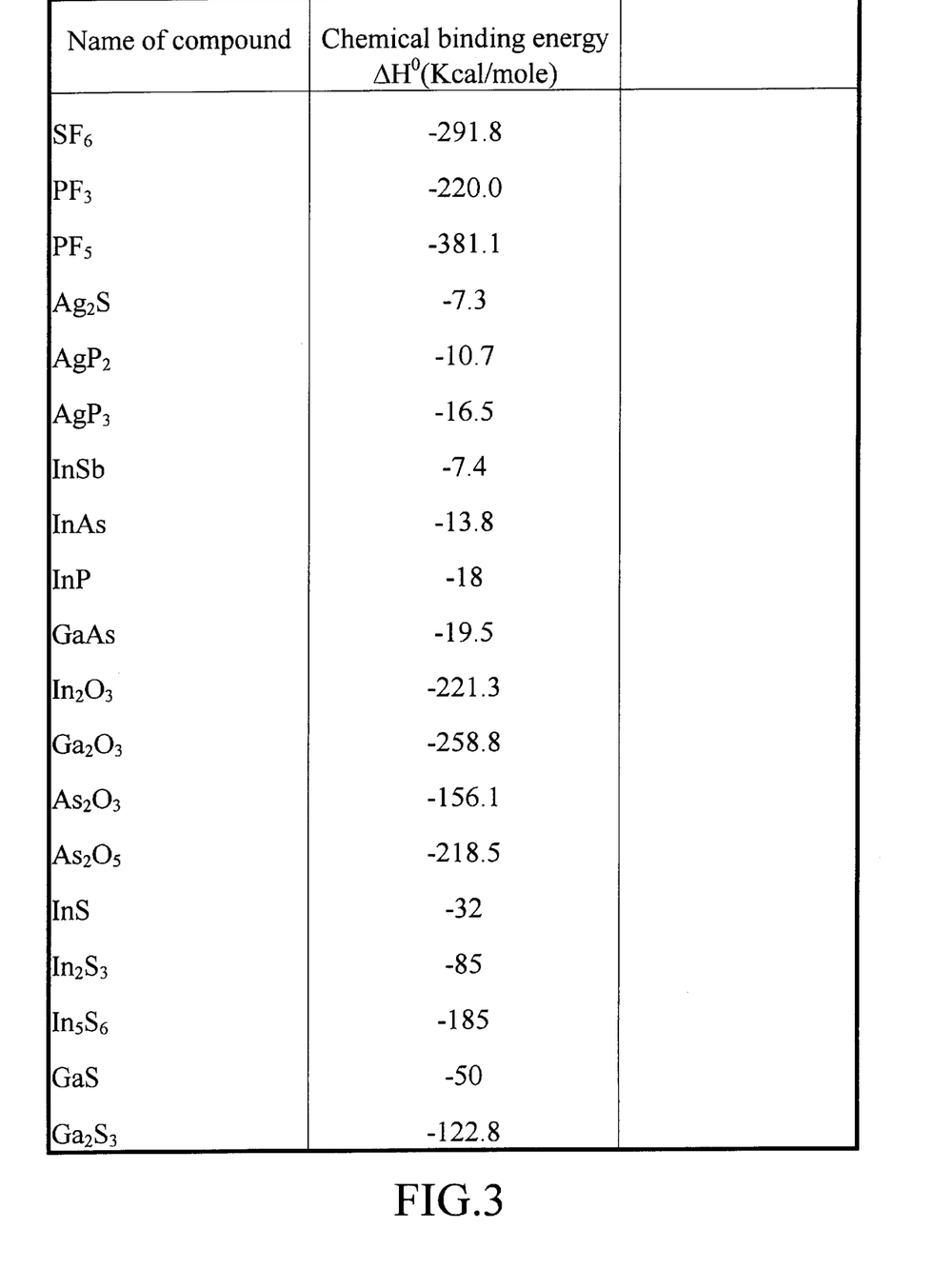
FIG. 3 is a schematic view showing surface chemical bonding energies of elements phosphorus and sulphur, and various composite semiconductors.
Figure 4:
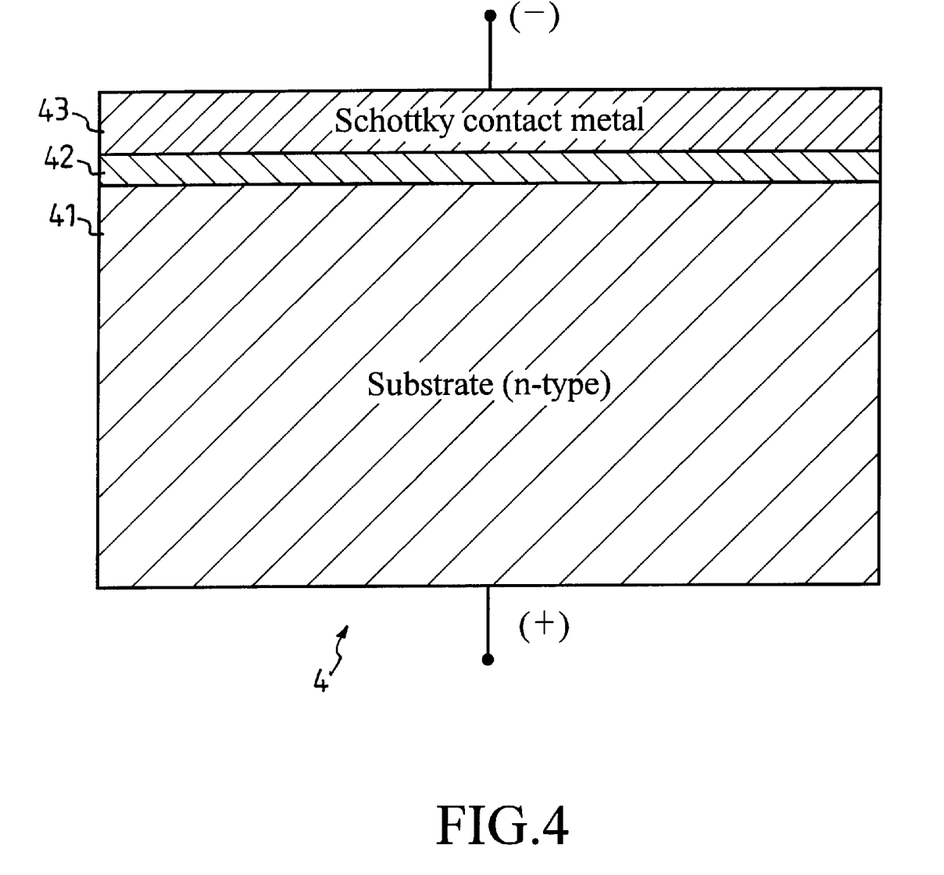
FIG. 4 is a cross-sectional view showing an improved Schottky contact having high-temperature proof and oxidation resistance according to the invention.
Figure 5:
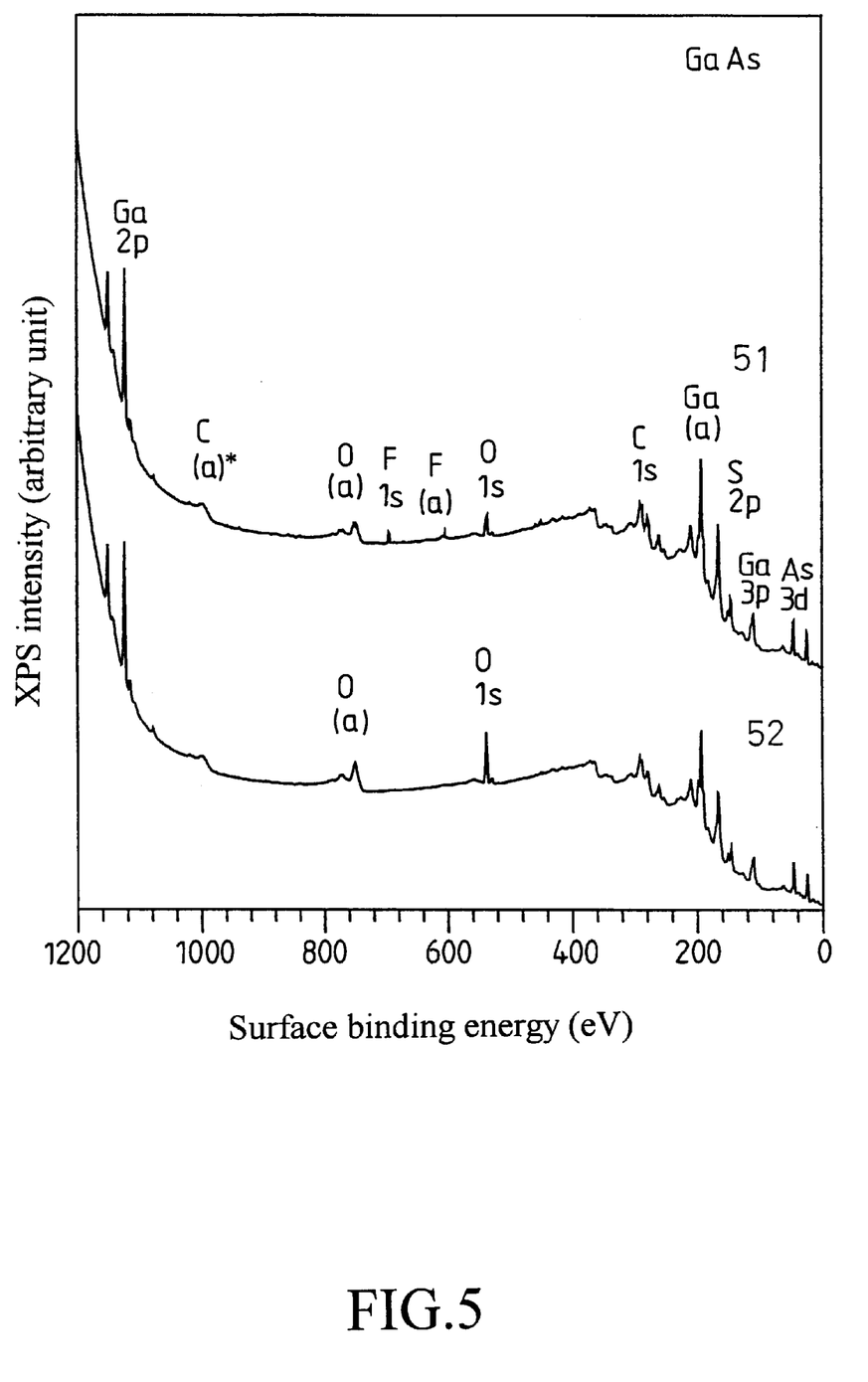
FIG. 5 is a comparative graph showing surface bonding energy gaps of a GaAs substrate by an XPS analysis after the GaAs substrate are baked for 18 hrs. at a temperature of 300° C.
Figure 6:
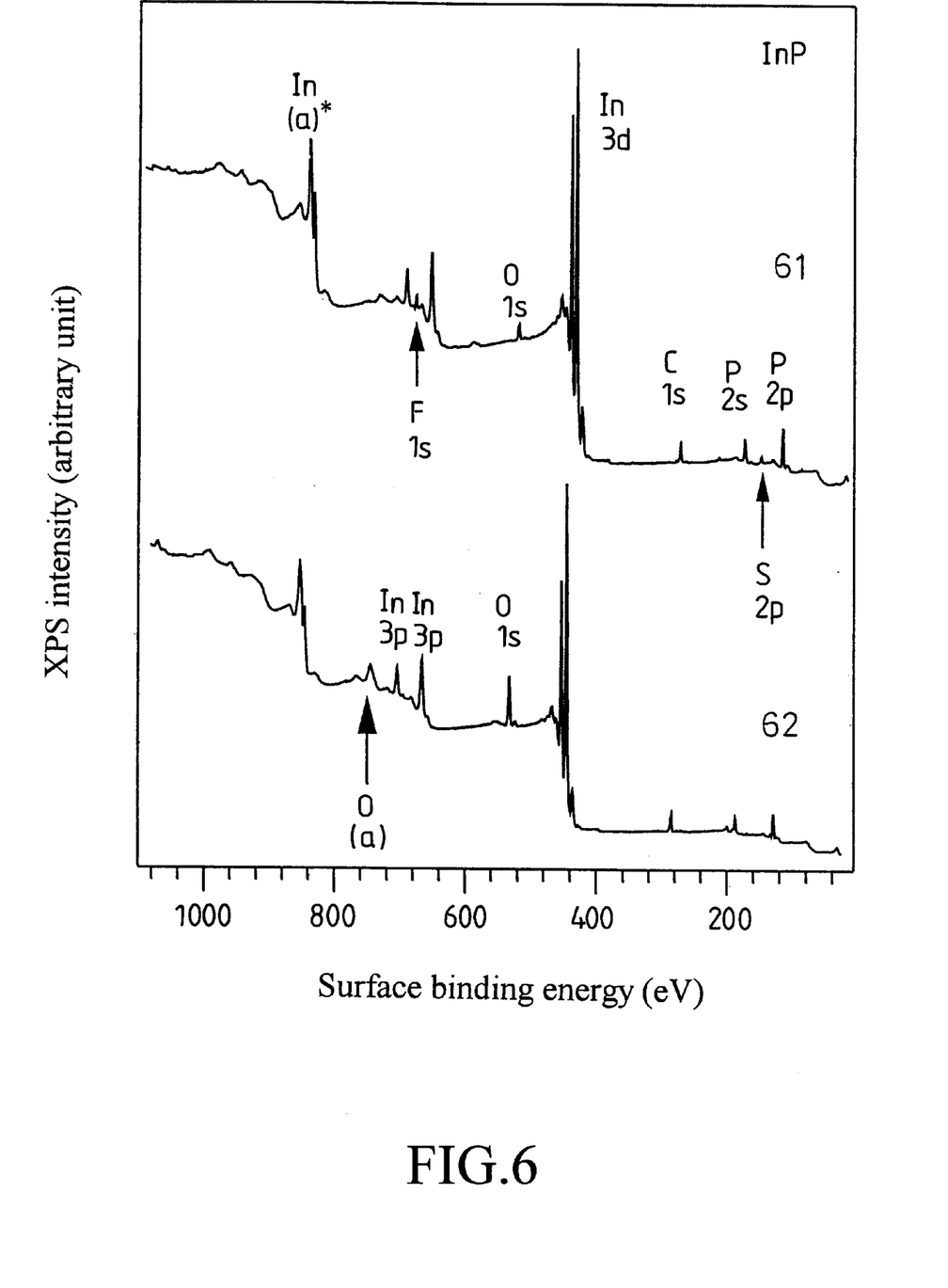
FIG. 6 is a comparative graph showing surface bonding energy gaps of an InP substrate by an XPS analysis after the InP substrate are baked for 18 hrs. at a temperature of 300° C.
Figure 7:
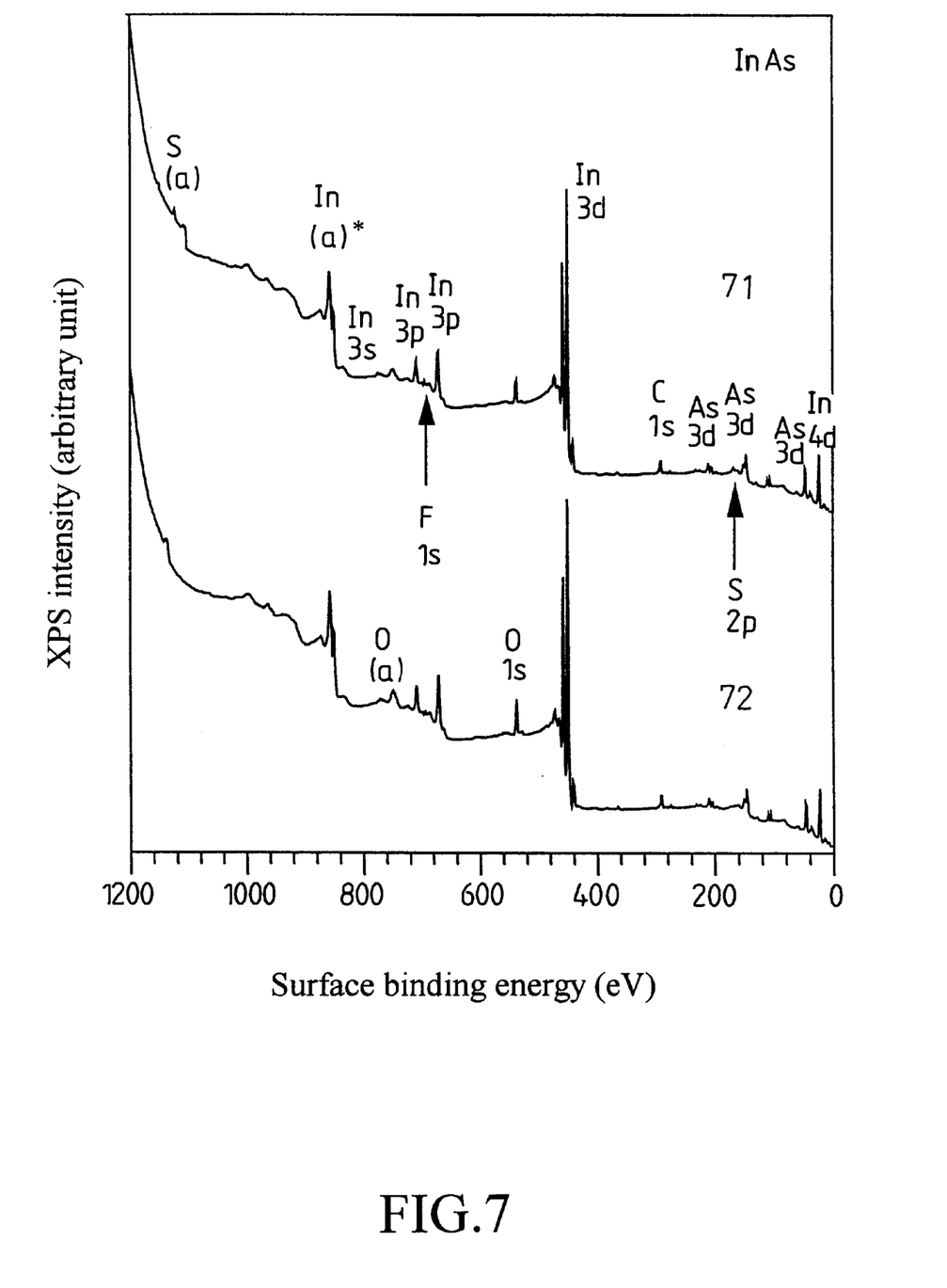
FIG. 7 is a comparative graph showing surface bonding energy gaps of an InAs substrate by an XPS analysis after the InAs substrate are baked for 18 hrs. at a temperature of 300° C.
Figure 8:
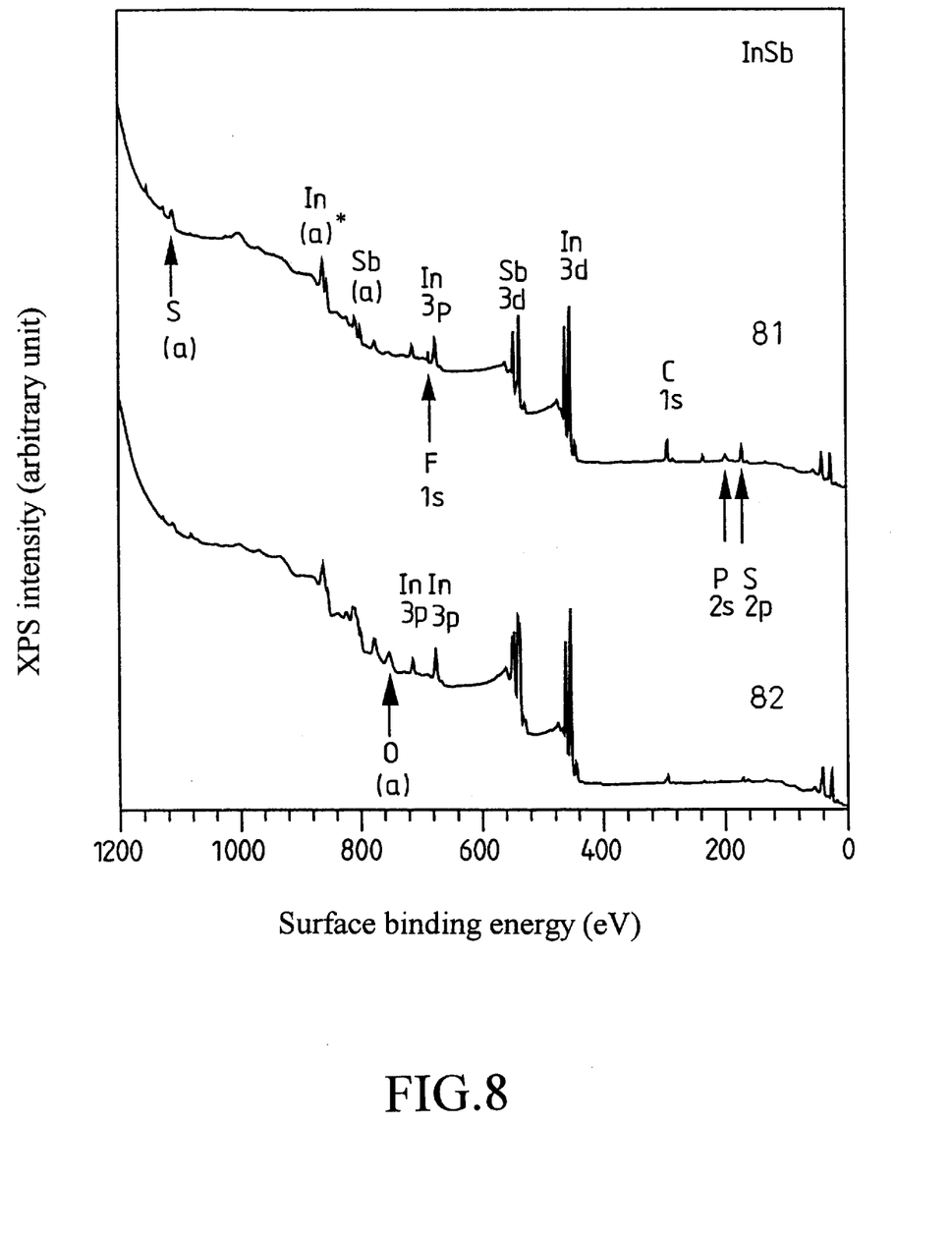
FIG. 8 is a comparative graph showing surface bonding energy gaps of an InSb substrate by an XPS analysis after the InSb substrate are baked for 18 hrs. at a temperature of 300° C.
Figure 9:
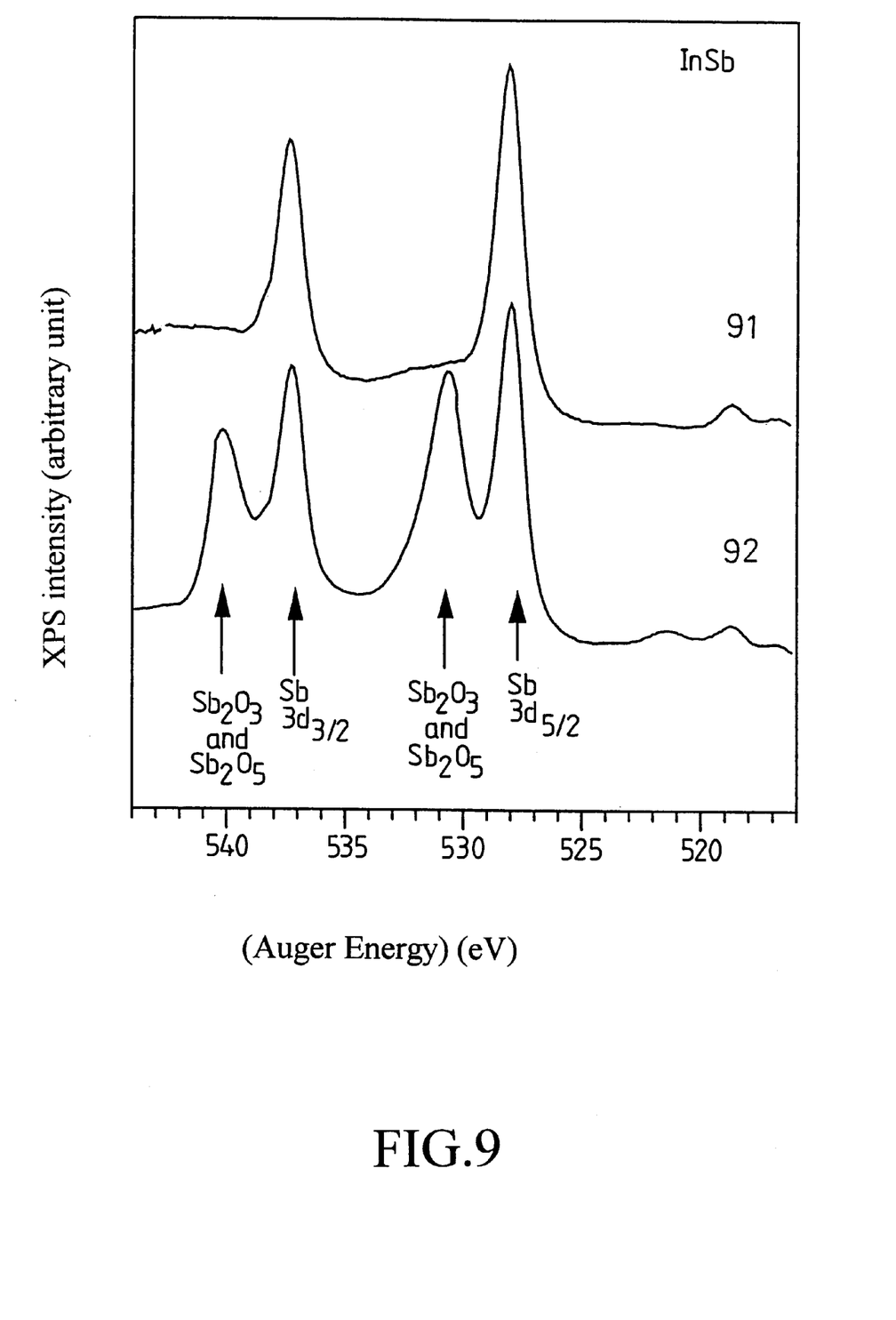
FIG. 9 is a comparative graph showing surface auger energies of an InSb substrate by an XPS analysis after the InSb substrate are baked for 18 hrs. at a temperature of 300° C.

As to a general Schottky contact, its semiconductor substrate can be an n-type or p-type composite. In the invention, n-type Group III–V composites, such as GaAs, InP, InAs and InSb, are taken as examples for clear description. According to the invention, the surface treatment of a composite semiconductor is used for reduce a surface state and oxidation, thereby increasing the Schottky barrier of a Group III–V composite (such as GaAs, InP, InAs or InSb) Schottky contact. Those skilled in the part can manufacture the Group III–V composites on p-type semiconductor substrates based on the principle of the invention. During experiments, a phosphorus sulphide/ammonia sulphide solution and hydrogen fluoride solution are used for surface treatment to increase the amount of sulphur contained on the surface, reduce a surface state and remove various oxides. Furthermore, ultra-thin and really stable sulphur fluoride/phosphorus fluoride layers having high energy gaps are formed on various substrates. Then, metals Ag, Au, Ni and Pt are sputtered by a single electron gun to form Schottky contacts. In addition, a UV light treatment for about 3 mins. is performed to enhancing the Schottky contacts as shown in FIG. 2. Even though the Schottky contacts formed by various Group III–V composites (GaAs, InP, InAs and InSb) and various metals are baked for 18 hrs. at a temperature of 300° C., their Schottky barriers can still reach about 1.1 eV, 0.95 eV, 0.37 eV and 0.19 eV, respectively. Thus, Schottky contacts with high yield can be manufactured according to the invention. In order to make the advantages and characteristics of the invention more clear. a method for manufacturing a Schottky contact according to a preferable embodiment of the invention will be described hereinafter: (1) referring to FIG. 4, first, a Group III–V composite semiconductor substrate 41 is dipped in to a solution containing phosphorus sulphide/ammonia sulphide ($P_2S_5/(NH_4)_2S_x$) with a proportion of 0.05g/ml. then taking it out and drying it with nitrogen; (2) the Group III–V composite semiconductor substrate 41 is re-dipped into a hydrogen fluoride (HF) solution, then taking it out immediately and drying it with nitrogen; (3) To enhance fluoridation, repeat steps (1) and (2) for 3 times; (4) next, in order to enhance the surface reaction of the composite semiconductor, a heating approach and treatments by various light sources each containing a UV ray can be performed on the surface of the composite semiconductor substrate 41. In the above-mentioned step (2), the hydrogen fluoride (HF) can be replaced with carbon tetrafluoride ($CF_4$). In the embodiment of the invention, a UV ray radiates to the surface of the composite, such as GaAs, InP, InAs or InSb, semiconductor for about 3 mins. to form a thin sulphur fluoride/phosphorus fluoride layer 42; (5) the surface of the thin sulphur fluoride/phosphorus fluoride layer 42 is sputtered with Ag, Au, Ni or Pt by an electron gun to form a Schottky contact metal layer 43, thereby obtaining a higher Schottky barrier. It is really surprised that after various substrates are put into an environment of high temperature for a long time, the thin sulphur fluoride/phosphorus fluoride layer 42 can still prevent oxidation and have high stability. FIG. 2 is a schematic view showing various results of measuring GaAs, InP, InAs, and InSb Schottky contacts sputtered with metal Ag under corresponding various conditions (for example, current-voltage (I–V) and capacitance-voltage (C–V) are measured after substrates with/without a fluoridation treatment are baked for 18 hrs. at a temperature of 300° C. As a result, it is found that the Schottky barrier without a surface treatment is about ½ of the semiconductor energy gap. A conventional Schottky contact with phosphorization and sulphuration treatments, but without a fluoride treatment is shown in FIG. 1. Referring to FIG. 3, it can be known from the chemical bonding energies of elements, phosphorus and sulphur, to the various composite semiconductor surfaces, wherein the phosphorus and sulphur are easily volatilized. Therefore it cannot operate at an environment of high temperature. A further test to prove the influence of the temperature to non-fluoridation is performed so as to describe the enhanced Schottky structure of the invention as shown in FIG. 4. Referring to FIGS. 5, 6, 7, 8 and 9, surface bonding energy analysis is obtained by an XPS analysis after the GaAs, InP, InAs and InSb substrates are baked for 18 hrs. at a temperature of 300° C., wherein curves 51, 61, 71 and 81 represent that the various substrates have been through phosphorus fluoride and sulphur fluoride treatments and have been baked for 18 hrs. at a temperature of 300° C. while curves 52, 62, 72 and 82 represent that the various substrates have been just through sulphur and phosphorus treatments and have been baked for 18 hrs. at a temperature of 300° C. The results of this test are described as follows:

(1) oxygen component on the surface of the substrates which have been through a sulphur treatment is reduced, thereby decreasing oxidation on the surface;

(2) a stable surface state is obtained by forming a phosphorus fluoride/sulphur fluoride material, and thereby sulphur does not escape from the surface. Since sulphur atoms can readily remove oxide, it is suitable to various composite semiconductor surfaces to form ultra-thin phosphorus fluoride/sulphur layers having high energy gaps and strong chemical bonds; and (3) a UV ray treatment is performed in the process to enhance the bonding strength of the fluoridation, wherein the power of the UV light source is less than that of the TV light source in a yellow light region, and thereby a chemical reaction can be processed and the characteristics, such as ohm contact, cannot be affected. Moreover, the Schottky barrier formed between precious metals Ni, Au and Pt, and various substrates is almost the same as that of Ag-semiconductor Schottky barrier.

A method for manufacturing Schottky contacts according to the invention is suitable for high-volume production and has an advantage of low cost. A high Schottky barrier is obtained by a dipping treatment and enhancement technique without greatly changing the whole process.

Although the invention has been disclosed in terms of a preferred embodiment, the disclosure is not intended to limit the invention. Those knowledgeable in the art can make modifications within the scope and spirit of the invention which is determined by the claims below.

What is claimed is:

1. A method for manufacturing a Schottky contact having high-temperature proof and oxidation resistance, comprising the following steps:

(a) dipping a composite semiconductor substrate into a solution containing phosphorus pentasulphide/ammonia sulphide ($P_2S_5/INH_4)_2S_x$) with a proportion of 0.05 g/ml for a dipping time of several minutes, and then drying said composite semiconductor substrate with nitrogen;

(b) performing a fluoride treatment on said composite semiconductor substrate;

(c) repeating steps (a)–(b) for several times; and (d) performing a UV ray treatment on said composite semiconductor substrate after step (c) for 3 mins. to form a thin sulphur fluoride/phosphorus fluoride layer.

2. The method for manufacturing a Schottky contact as claimed in claim 1, wherein said dipping time in step (a) is about 3 mins.

3. The method for manufacturing a Schottky contact as claimed in claim 1, wherein said fluoride in step (b) can be a hydrogen fluoride (HF) solution or carbon tetrafluoride ($CF_4$).

4. The method for manufacturing, a Schottky contact as claimed in claim 1, wherein repeating 3 times in step (c) can obtain a preferable thin layer.

5. The method for manufacturing a Schottky contact as claimed in claim 1, further comprising the following step:

(e) forming a Schotticy contact metal layer by evaporating or sputtering the surface of said thin layer with a precious metal.

6. The method for manufacturing a Schottky contact as claimed in claim 1, wherein said thin layer has a thickness of 50–150 Å.

* * * * *